(12) United States Patent
Shah

(10) Patent No.: US 6,377,463 B1
(45) Date of Patent: Apr. 23, 2002

(54) RETENTION MODULE FOR PROCESSOR AND CHIPSET THERMAL SOLUTIONS

(75) Inventor: Ketan R. Shah, Tumwater, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/735,254

(22) Filed: Dec. 12, 2000

(51) Int. Cl.$^7$ .................................................. H05K 7/20
(52) U.S. Cl. ..................... 361/720; 361/704; 361/707; 361/709; 361/719; 257/712; 165/80.3; 165/185
(58) Field of Search .................. 361/688–690, 361/697, 704, 707, 717–719; 257/706, 717–719, 721, 722, 727; 174/16.3; 165/80.2, 80.3, 185

(56) References Cited

U.S. PATENT DOCUMENTS

| | | | | |
|---|---|---|---|---|
| 5,019,940 A | * | 5/1991 | Clemens | 361/723 |
| 5,251,101 A | * | 10/1993 | Liu | 361/717 |
| 5,307,239 A | * | 4/1994 | McCarty et al. | 361/704 |
| 5,477,916 A | * | 12/1995 | Lin | 165/80.3 |
| 5,808,236 A | * | 9/1998 | Brezina et al. | 174/16.3 |
| 6,180,874 B1 | * | 1/2001 | Brezina et al. | 174/16.3 |
| 6,239,972 B1 | * | 5/2001 | Tehan et al. | 361/704 |

* cited by examiner

Primary Examiner—Leo P. Picard
Assistant Examiner—Boris L. Chervinsky
(74) Attorney, Agent, or Firm—Schwegman, Lundberg, Woessner & Kluth, P.A.

(57) ABSTRACT

A heat sink apparatus includes a first heat sink thermally coupled with at least a first component of a substrate, and a second heat sink thermally coupled with at least a second component of the substrate. The apparatus further includes a unitary retention module coupled with the first heat sink and the second heat sink, where the unitary retention module is also coupled with the substrate.

25 Claims, 4 Drawing Sheets

RETENTION MODULE FOR PROCESSOR AND CHIPSET THERMAL SOLUTIONS

TECHNICAL FIELD

The present invention relates generally to heat sinks and in particular relates to heat sinks and retention modules for retaining heat sinks to substrates and heat producing components.

BACKGROUND

Processors and related computer components are becoming more powerful with increasing capabilities, resulting in increasing amounts of heat dissipated from these components. Simultaneously, package and die sizes of the components are decreasing or remaining the same, which increases the amount of heat energy given off by the component for a given unit of surface area. Furthermore, as computer related equipment becomes more powerful, more chips are surface mounted to the printed circuit board, more and more components are being placed inside the equipment or chassis which is also decreasing in size, resulting in additional heat generation in a smaller volume of space. Increased temperatures can potentially damage the components of the equipment, or reduce the lifetime of the individual components and the equipment.

Heat sinks have been used to assist in dissipating heat from the processor and other heat producing components within a housing. The overall size of the heat sink is limited by the volume constraints of the housing. Heat dissipation has been increased by using clips which physically hold a heat sink to the processor package. To maximize the amount of heat dissipated from the heat producing components, a spring force is used in coupling the heat sink with the heat producing component. However, when assembling the heat sink with the heat producing component, the assembly of the spring clip causes the printed board at and adjacent to the heat producing component to flex, resulting in stress to the solder balls between the chips and the printed circuit boards. In addition, tough handling processes, such as shipping and/or testing place additional stresses on the circuit board and/or the components, increasing the risk of failure to the structurally weak solder balls.

Accordingly, there is a need for a way to cool components without increasing the risk of damage to a substrate. What is further needed is a way to cool components without increasing risk of damage to surface mounted components. There is also a need for minimizing damage to the connections between the chips and the printed circuit boards.

DETAILED DESCRIPTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present invention is defined only by the appended claims.

Figure 1:
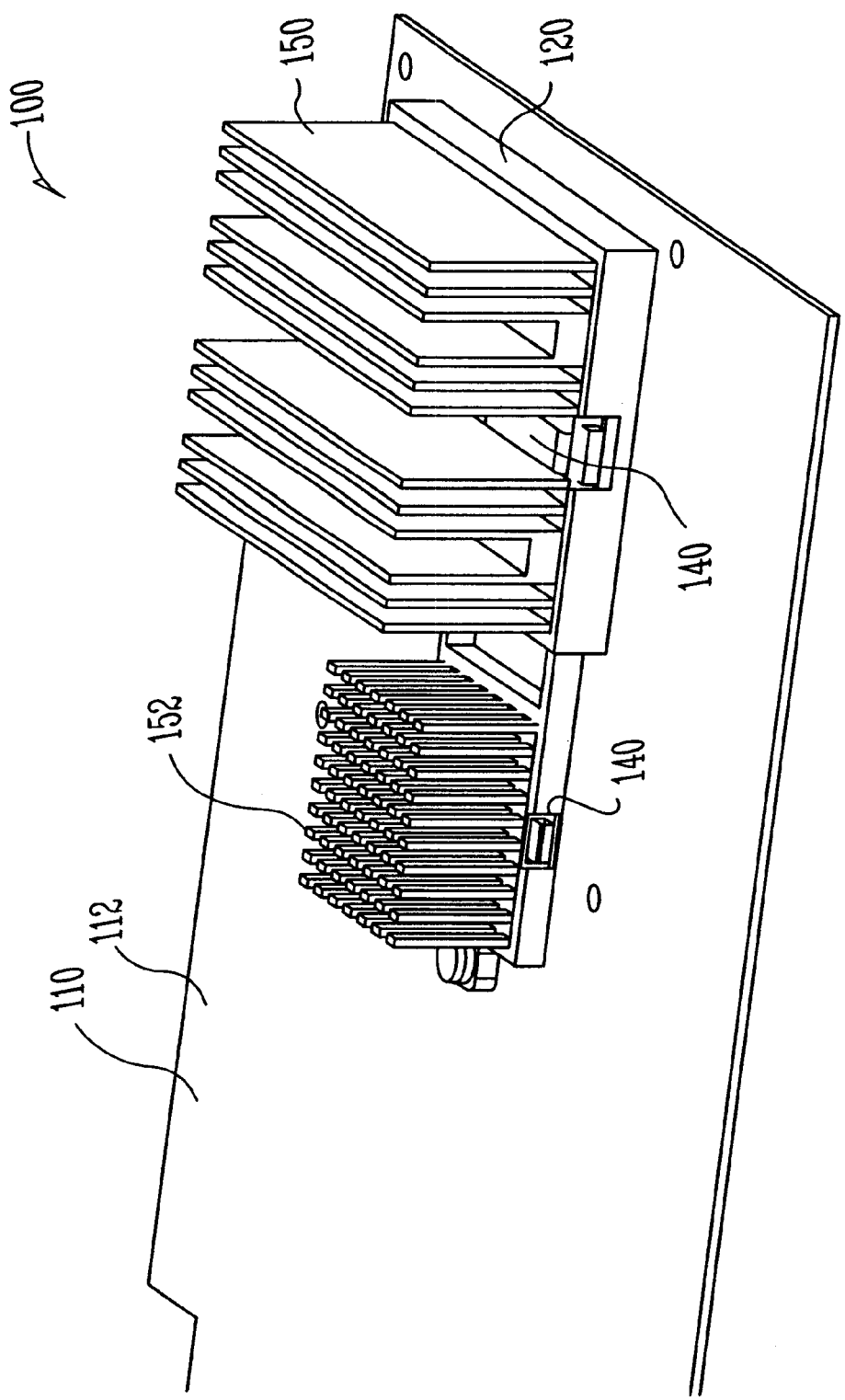
FIG. 1 illustrates a perspective view of a heat sink apparatus constructed in accordance with one embodiment.

A heat sink apparatus is generally shown in FIG. 1. The heat sink apparatus 100 includes a substrate 110, such as a printed circuit board 112, a unitary retention module 120, at least a first heat sink 150. One example of a substate 110 includes, but is not limited to, a motherboard. Optionally, the heat sink apparatus 100 includes at least a second heat sink 152, as farther discussed below.

Figure 2:
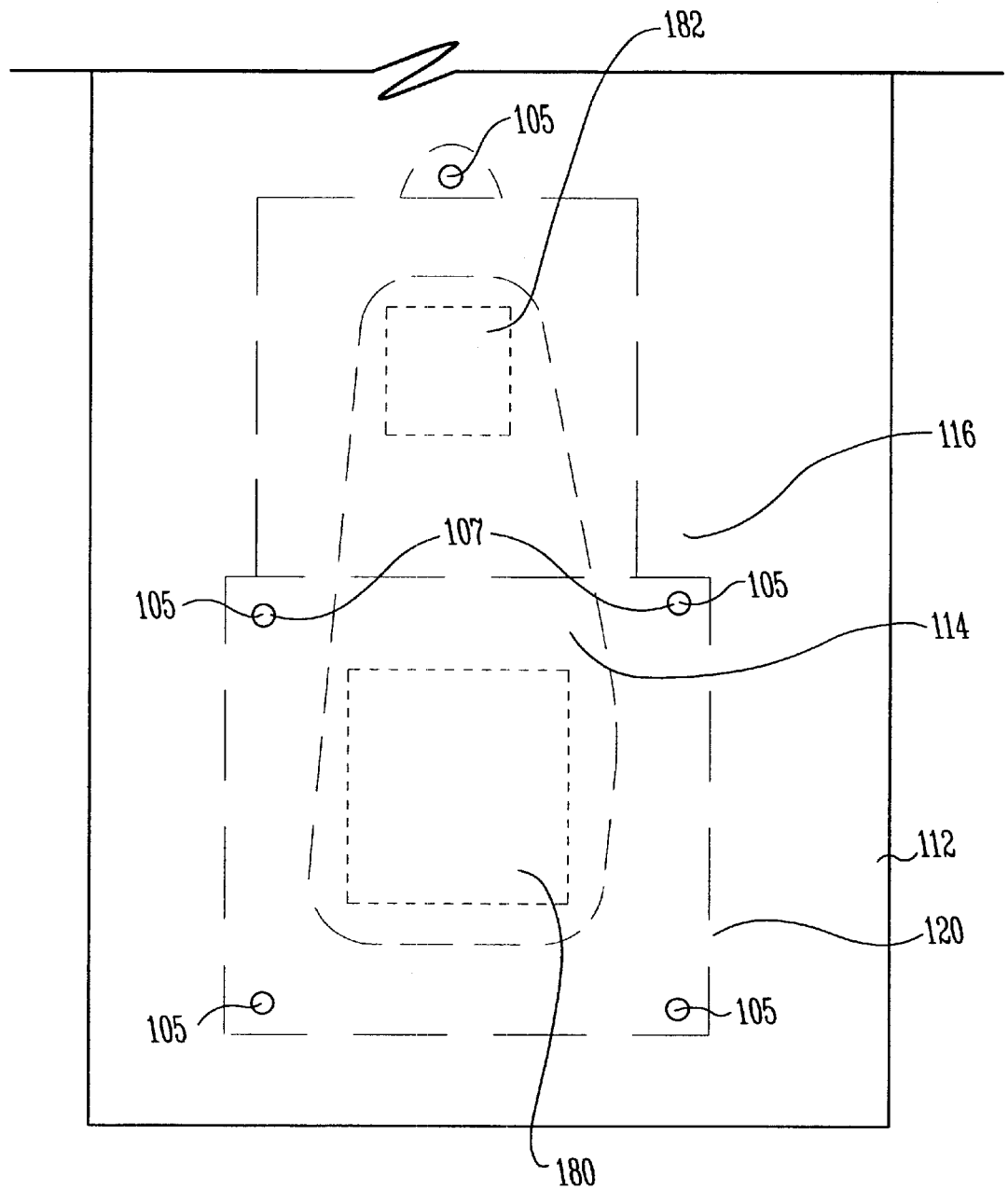
FIG. 2 illustrates a bottom view of a printed circuit board and a heat sink apparatus constructed in accordance with one embodiment.

Referring to FIG. 2, a bottom view of the printed circuit board 112 is shown. The printed circuit board 112 includes a first heat producing component 180 mounted thereon, and optionally a second heat producing component 182 mounted thereon. In one example, the first heat producing component 180 comprises a processor, and the second heat producing component 182 comprises a chipset, although it should be noted that other components are suitable heat producing components.

The first and second heat producing components 180, 182 are mounted on the printed circuit board 112 in a number of manners, for example, by placing the components 180, 182 on mounting pads, and directing the loaded printed circuit board through a solder reflow process. The first and second heat producing components 180, 182 are mounted on the printed circuit board 112 in a core area 114 of the printed circuit board 112. The core area 114 relates to an area in which sensitive and/or fragile components are mounted on the printed circuit board 112. The core area 114 further relates to an area where electrical routing is dense. The printed circuit board 112 further includes a non-core area 116, which is outside of the core area 114.

Figure 3:
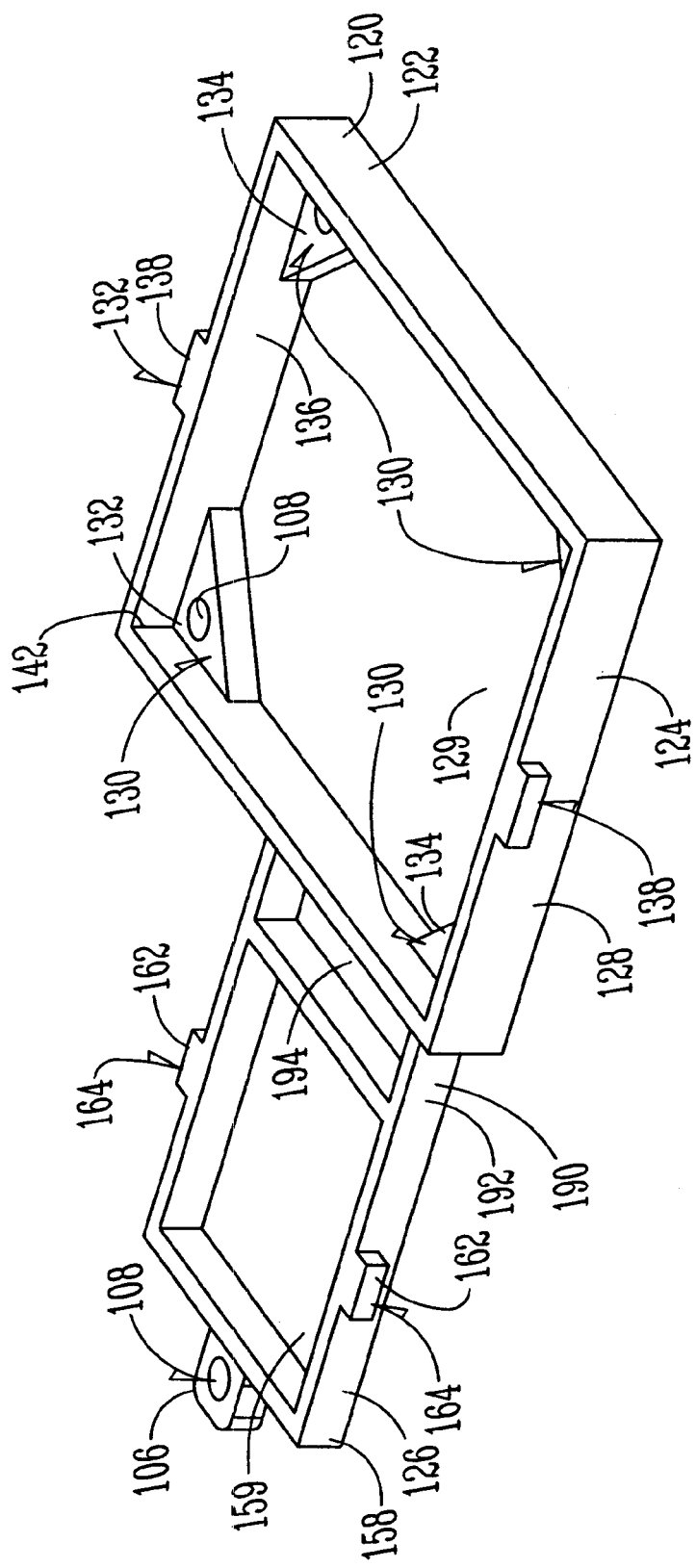
FIG. 3 illustrates a perspective view of a unitary retention module constructed in accordance with one embodiment.

Referring to FIG. 3, the unitary retention module 120 is shown in greater detail. The unitary retention module 120 is adapted to be coupled with a first heat sink 150 (FIG. 1) and a second heat sink 152 (FIG. 1), although it should be noted that the unitary retention module 120 is useable with a single heat sink, or a plurality of heat sinks, including three or more heat sinks. The unitary retention module 120 includes an outer perimeter wall 122 and has a first portion 124 for receiving the first heat sink 150 (FIG. 1) and a second portion 126 for receiving the second heat sink 152 (FIG. 1).

The first portion 124 includes a first perimeter wall 128 which at least partially surrounds the first heat sink 150 (FIG. 1). Disposed within the first perimeter wall 128 is a first open area 129 or a first cut out, which allows for the first heat sink 150 (FIG. 1) to make thermal contact with the first heat producing component 180 (FIG. 2). The first perimeter wall 128 generally conforms to the shape of a heat sink, for example, a rectangular shape, although other shapes are suitable as well. The first portion 124 further includes mounting structures 130 for mounting the unitary retention module 120 to the printed circuit board 112 (FIG. 1), as will be further discussed below. The first portion 124 further includes heat sink mounting structures 132.

In one option, the heat sink mounting structures 132 include a shelf portion 134 coupled with at least a portion of an interior surface 136 of the first perimeter wall 128. In one example, a shelf portion 134 is disposed at each corner 142 of the interior surface 136 of the first perimeter wall 128. In another option, a shelf portion 134 is disposed at less than each corner 142, for instance, in two corners opposite the second portion 126, or in two opposite corners. Alternatively, the shelf portion 134 includes portions disposed in locations other than the corner 142 of the interior surface 136. For example, the shelf portion 134 could include a ridge which extends around the entire interior surface, small posts which extend from the interior surface 136, or other structures adapted to support a heat sink thereon. It should be noted that the shelf portions 134 alternatively could extend from the first perimeter wall 128 in places other than the interior surface 136.

In another option, the heat sink mounting structures 132 include, in addition to, or in alternative to the shelf portion 134, a set of tabs 138. A spring 140 (FIG. 1) is coupled with the tabs 138 over the first heat sink 150 (FIG. 1), as further discussed below. The tabs 138 are formed of sufficient structure and/or rigidity to support the force of the spring 140 (FIG. 1), without damage to the unitary retention module 120. It should be noted that other mounting features other than tabs 138 are suitable as well, for example, recesses disposed within the first perimeter wall 128 of the unitary retention module 120.

The unitary retention module 120 further includes a second portion 126 for receiving the second heat sink 152 (FIG. 1). The second portion 126 includes a second perimeter wall 158 which at least partially surrounds the second heat sink 152 (FIG. 1). In one option, the second perimeter wall 158 is continuous with the first perimeter wall 128. Disposed within the second perimeter wall 158 is a second open area 159, which allows for the second heat sink 152 (FIG. 1) to make thermal contact with the first heat producing component 182 (FIG. 2). The second perimeter wall 158 generally conforms to the shape of a heat sink, for example, a square shape, although other shapes are suitable as well. The second portion 126 further includes at least one mounting structure for mounting the unitary retention module 120 to the printed circuit board 112 (FIG. 1), as will be further discussed below. The second portion 126 further includes heat sink mounting structures 162.

In one option, the heat sink mounting structures 162 include a set of tabs 164. A spring 140 (FIG. 1) is coupled with the tabs 164 over the second heat sink 152 (FIG. 1), as further described below. The tabs 164 are formed of sufficient structure and/or rigidity to support the force of the spring 140 (FIG. 1), without damage to the unitary retention module 120 or the heat sink 152. In a further option, the heat sink mounting structures 162 include a shelf as in the first portion 124 of the unitary retention module 120.

Disposed in between the first portion 124 and the second portion 126 is an intermediate portion 190. The intermediate portion 190 includes an intermediate perimeter wall 192 which is optionally shared in part by the first perimeter wall 128 of the first portion 124 and the second perimeter wall 158 of the second portion 126. The intermediate portion 190, in one option, includes an open area 194 or a third cut out which is bordered by the intermediate perimeter wall 192. The open area 194 allows for less material to be used when forming the unitary retention module 120, while maintaining sufficient rigidity to be imparted to the printed circuit board 112 (FIG. 1).

As mentioned above, the unitary retention module 120 includes mounting structures adapted for mounting the unitary retention module 120 to the printed circuit board 112 (FIG. 1). In one example, the mounting structures include mounting holes 108, which adapted to receive a fastener 105 (FIG. 2) therethrough. The unitary retention module 120 includes five or less mounting holes 108, which preserves significant surface area of the printed circuit board 112 (FIG. 1). In one option, at least one of the mounting holes 108 is disposed in a tab 106 on an exterior wall 104 of the unitary retention module 120, for instance, a tab 106 adjacent to the second portion 126. In another option, at least one of the mounting holes 108 is disposed within a shelf portion 134, in addition to, or in alternative to a hole 108 in the tab 106.

The mounting holes 108 are coupled with structure of the unitary retention module 120 in locations which fall outside of the core area 114 (FIG. 2). Since the mounting structures are used to couple the unitary retention module 120 with the printed circuit board 112 (FIG. 1) in a non-core area 116 (FIG. 2) of the printed circuit board 112 (FIG. 1), valuable real estate on the printed circuit board 112 (FIG. 1) is conserved. In a further option, mounting holes 107 (FIG. 2) are eliminated, thereby freeing up additional real estate on the printed circuit board 112. It should be noted that other or alternative mounting holes can also be eliminated to provide for additional real estate on the printed circuit board 112.

The unitary retention module 120 is formed as a rigid component, for example, using rigid material or coupling the module 120 with rigid material. Suitable materials for the unitary retention module 120 include, but are not limited to, plastic, ceramic, etc. Other options for incorporating rigidity into the unitary retention module 120 include forming at least a portion of the unitary retention module 120 of rigid material, or incorporating structure into the unitary retention module 120 to improve rigidity. For example, additional structure can be formed on the outer perimeter wall of the unitary retention module 120, or a stiffening member is formed within the unitary retention module 120. The unitary retention module 120, when coupled with the printed circuit board 112 (FIG. 1) imparts rigidity to the printed circuit board 112, assisting in preventing damage to components mounted thereon during testing, flexing, and/or shipping of the printed circuit board 112. In addition, the springs which mount the heat sink impart forces which flex the printed circuit board in a downward direction. It has been found that the downward flex pre-loads solder balls of the components 180, 182 in compression, and prevents them from being loaded in tension during shipping and handling of the printed circuit board 112. The unitary retention module 120 improves the strength of the solder balls for the components 180, 182.

Figure 4:
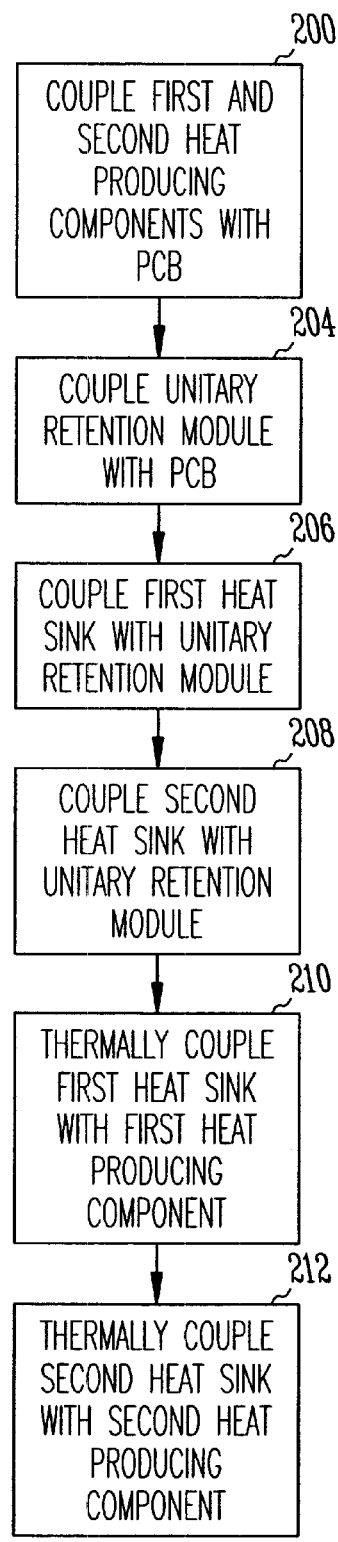
FIG. 4 illustrates a block diagram of a method in accordance with one embodiment.

A method for manufacturing a heat sink apparatus and/or cooling a heat producing component is described herein, where a block diagram of the method is shown at FIG. 4. The method includes coupling a first heat producing component to a printed circuit board, and coupling a second heat producing component to the printed circuit board at 200. For instance, the first and second heat producing components are coupled with the printed circuit board using solder balls and a reflow process. In one option, coupling the first heat producing component and coupling the second heat producing component includes coupling the first and second heat producing components within a core area of the printed circuit board.

At 204, the unitary retention module is mechanically coupled with the printed circuit board. In one example, the unitary retention module is placed on the printed circuit board, and mounting holes of the unitary retention module are aligned in a non-core area of the printed circuit board. Fasteners are disposed through the mounting holes of the unitary retention module. In one option, coupling the unitary retention module with the printed circuit board includes disposing five or fewer fasteners within five or fewer mounting holes of the unitary retention module.

The method further includes at 206 mechanically coupling a first heat sink and a second heat sink with the unitary retention module, at 210, thermally coupling the first heat sink with the first heat producing component, and at 212, thermally coupling the second heat sink with the second heat producing component. In one option, coupling the first heat sink and the second heat sink with the unitary retention module, the first heat producing component, and the second heat producing component includes disposing the heat sinks over the heat producing component, and disposing a spring clip over each of the first and second heat sinks and fastening the spring clips to the unitary retention module. For instance, the spring clips includes openings which are placed over tabs of the unitary retention module. The method reduces the number of assembly steps, allowing for a faster, more cost efficient assembly.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A heat sink apparatus comprising:
   a substrate having a first heat producing component and a second heat producing component, the substrate further including a core area and a non-core area;
   at least a first heat sink thermally coupled with the first heat producing component of the substrate in the core area of the substrate;
   at least a second heat sink thermally coupled with the second heat producing component of the substrate in the core area of the substrate;
   a unitary retention module coupled with the first heat sink and the second heat sink, the unitary retention module coupled with the substrate in the non-core area of the substrate; and
   the first heat sink and the second heat sink separated from each other by an intermediate portion therebetween.

2. The heat sink apparatus of claim 1, wherein the unitary retention module includes a first perimeter wall surrounding at least a portion of the first heat sink, at least a portion of the first perimeter wall disposed between the first heat sink and the second heat sink.

3. The heat sink apparatus of claim 2, wherein the unitary retention module includes a second perimeter wall surrounding at least a portion of the second heat sink, at least a portion of the second perimeter wall disposed between the first heat sink and the second heat sink.

4. The heat sink apparatus of claim 1, wherein the unitary retention module is mechanically coupled with the first and second heat sinks, and the unitary retention module is mechanically coupled with the substrate.

5. The heat sink apparatus of claim 3, wherein the intermediate portion has a third cut out therein, and the third cut out is disposed between the first perimeter wall and the second perimeter wall.

6. The heat sink apparatus of claim 1, wherein the unitary retention module is rigid.

7. The heat sink apparatus of claim 1, wherein the unitary retention module includes five or less mounting holes.

8. The heat sink apparatus of claim 1, further including at least one mounting shelf, wherein the at least one mounting shelf includes at least one mounting hole therein.

9. The heat sink apparatus of claim 8, the retention module including an outer wall having an inner surface, wherein the at least one mounting shelf is coupled with the inner surface.

10. The heat sink apparatus of claim 1, the retention module disposed between the first heat sink and the substrate, the retention module disposed between the second heat sink and the substrate.

11. The heat sink apparatus of claim 1, wherein the first heat producing component includes a processor and the second heat producing component comprises a chipset.

12. An apparatus comprising:
    a printed circuit board having a core area and a non-core area;
    a first heat producing component disposed on the printed circuit board within the core area;
    a second heat producing component disposed on the printed circuit board within the core area;
    a first heat sink thermally coupled with the first heat producing component;
    a second heat sink thermally coupled with the second heat producing component; and
    a unitary retention module disposed between the first heat sink and the printed circuit board, the unitary retention module coupled to the non-core area and disposed between the second heat sink and the printed circuit board, the unitary retention module adapted to couple the first and second heat sinks with the printed circuit board in the non-core area.

13. The apparatus of claim 12, wherein the unitary retention module includes five or less mounting structures including a tab on an exterior wall of the retention module, and further comprising a fastener coupled with each mounting structure and the printed circuit board in the non-core area.

14. The apparatus of claim 12, wherein the unitary retention module includes a first cut out and a second cut out, the first cut out receives the first heat sink therein, and the second cut out receives the second heat sink therein.

15. The apparatus of claim 14, wherein the unitary retention module includes a third cut out disposed between the first cut out and the second cut out.

16. The apparatus of claim 15, wherein the third cut out includes a perimeter wall portion.

17. A method comprising:
    coupling a first heat producing component to a printed circuit board;
    coupling a second heat producing component to the printed circuit board;
    coupling a unitary retention module to the printed circuit board;
    spacing a first heat sink separate and away from a second heat sink;
    coupling the first heat sink and the second heat sink to the unitary retention module; and
    thermally coupling the first heat sink with the first heat producing component, and thermally coupling the second heat sink with the second heat producing component.

18. The method of claim 17, wherein coupling the first heat producing component and coupling the second heat producing component includes coupling the first and second heat producing components within a core area of the printed circuit board, and coupling the unitary retention module to the printed circuit board includes coupling the unitary retention module to the printed circuit board within a non-core area of the printed circuit board.

19. The method of claim 17, wherein coupling the unitary retention module to the printed circuit board includes disposing five or fewer fasteners within five or fewer mounting holes of the unitary retention module.

20. The method of claim 17, wherein coupling the first and second heat sinks to the unitary retention module includes disposing a spring clip over each of the first and second heat sinks and fastening the spring clips to the unitary retention module.

21. A unitary retention module comprising:

a first portion having a first perimeter wall and a first open area within the first perimeter wall, the first portion configured to couple with a heat sink;

a second portion having a second perimeter wall and a second open area within the second perimeter wall, the second portion configured to couple with a heat sink, the first perimeter wall continuous with the second perimeter wall, a portion of the first perimeter wall disposed between the first open area and the second open area; and the first portion and the second portion formed of rigid material.

22. The unitary retention module of claim 21, wherein the unitary retention module includes an intermediate portion having a third cut out therein, and the third cut out is disposed between the first perimeter wall and the second perimeter wall.

23. The unitary retention module of claim 21, wherein the unitary retention module includes five or less mounting holes.

24. The unitary retention module of claim 21, further including at least one mounting shelf.

25. The unitary retention module of claim 24, the retention module including an outer wall having an inner surface, wherein the at least one mounting shelf is coupled with the inner surface.

* * * * *